United States Patent

Neuberger et al.

[11] Patent Number: 5,965,216
[45] Date of Patent: Oct. 12, 1999

[54] METHOD OF PRODUCING DIAMOND-LIKE-CARBON COATINGS

[75] Inventors: Wolfgang Neuberger, F.T. Labuan, Malaysia; Denis Dowling, Co-Dublin, Ireland; Kevin Donnely; Terence O'Brien, both of Dublin, Ireland; Thomas Kelly, Co-Dublin, Ireland

[73] Assignee: Ceram Optec Industries, Inc., East Longmeadow, Mass.

[21] Appl. No.: 08/806,839

[22] Filed: Feb. 26, 1997

Related U.S. Application Data

[63] Continuation-in-part of application No. 08/414,913, Mar. 31, 1995, abandoned.

[51] Int. Cl.$^6$ .............................. B05D 3/06; C23C 16/26
[52] U.S. Cl. .................. 427/577; 427/534; 427/249; 427/255.5; 427/309; 427/122
[58] Field of Search ................. 427/577, 255.5, 427/249, 534, 122, 307, 309; 423/446

[56] References Cited

U.S. PATENT DOCUMENTS

| | | |
|---|---|---|
| 4,663,183 | 5/1987 | Ovshinsky et al. . |
| 5,011,705 | 4/1991 | Tanaka ..................................... 427/534 |
| 5,182,132 | 1/1993 | Murai et al. ............................. 427/577 |
| 5,431,963 | 7/1995 | Rzad et al. ............................... 427/534 |
| 5,470,661 | 11/1995 | Bailey et al. . |
| 5,768,046 | 6/1998 | Lee et al. ................................. 360/84 |

OTHER PUBLICATIONS

Grill, Patel & Muyerson, "Tribiological Behavior of Diamond–like Carbon" Surface & Coatings Technology 49, p. 530–36 (1991) No month data.
Evans Fronhs & Revell, "Diamond–like Carbon Applied to Bioengineering Materials," Surface & Coatings Technology 47 662–67 (1991) No month data.
Grill, "Review of the Tribology of Diamond–like Carbon" Wear 168 p. 143–53 (1993) No month data.
Grant et al "Phorna Assisted CVD for Biomd. Appl." Diamond & Related Metals 1 p. 727–30 (1992) No month data.

*Primary Examiner*—Roy V. King
*Attorney, Agent, or Firm*—Bolesh J. Skutnik; B J Associates

[57] ABSTRACT

A rf plasma enhanced chemical vapor deposition process is presented, wherein a precursor gas stream having a high helium content produces hard, wear resistant, hermetically sealing, high refractive index Diamond-Like-Carbon (DLC) coatings on numerous substrates at deposition rates of at least 0.4 μm/hr. Internal pressures of 1 to 10 Torr and radio frequencies no higher than 100 kHz are employed. The process may be applied to both batch and linear production methods. Linear products such as optical fibers, capillary tubing, wires, and sheets can be coated in-line while minimizing the introduction of flaws on their surfaces and minimizing exacerbation of any pre-existing flaws. The effects of surface flaws can be minimized further by introducing a helium etch of the substrate surface prior to exposure to the DLC coating precursor gas mixture.

10 Claims, 3 Drawing Sheets

METHOD OF PRODUCING DIAMOND-LIKE-CARBON COATINGS

REFERENCE TO RELATED CASE

This application is a continuation-in-part of U.S. patent application Ser. No.08/414,913 filed on Mar. 31, 1995, now abandoned by Wolfgang Neuberger, Denis Dowling, Kevin Donnely, Terence O'Brien and Tom Kelly, inventors entitled "METHOD OF PRODUCING DIAMOND-LIKE-CARBON COATINGS", and incorporated by reference herein.

BACKGROUND OF THE INVENTION

1. Field Of The Invention

The field of this invention is plasma assisted chemical vapor deposition of diamond-like-carbon (DLC) coatings applied to individual substrates, such as integrated chips, or to linear substrates such as fibers, wires, tubes, and sheets. In particular, methods are given which produce DLC coatings that can protect substrates, can function as hermetic coatings, and can be applied to individual and linear substrates.

2. Information Disclosure Statement

Due to their hardness and wear resistance DLC films [A Grill, "Review of the tribology of diamond-like carbon," *Wear*, 168 (1993) 143–153] are used as protective coatings with applications ranging from IR optics to cutting tools. In addition, because of their amorphous structure and lack of grain boundaries they can also act as hermetic coatings with applications ranging from vapor barriers coatings on plastics to protective coatings preventing the diffusion of small gas molecules into optical fibers. These advantages are particularly important when fibers are imbedded in an application without plastic jackets. An example would be optical fibers used in optical gyroscopes; as temperatures change DLC coatings keep the fiber from being damaged. Another usage is where tight windings for small, compact packaging is required, as in guided missile payout tethers.

A range of techniques have been developed to deposit these coatings, including magnetron sputtering, neutral atom beam, dc discharges, and radio frequency (rf) discharges. A. C. Evans, J. Franks and P. J. Revell, "Diamond-like carbon applied to bioengineering materials," *Surface and Coating Technology*, 47 (1991) 662–667, A Grill, V. Patel and B. Meyerson, "Tribological behavior of diamond-like carbon: effects of preparation conditions and annealing," *Surface and Coatings Technology*, 49 (1991) 530–536. Of these techniques, rf plasmas have been most widely used. The majority of work has been at 13.56 MHz, but work at lower frequencies, 2.3 to 3.75 MHG, has yielded similar results for given film compositions. Typical depositions employ hydrocarbon pressures ranging from 0.01 to 0.1 Torr and rf powers of about 1 W/cm$^2$ over the cathode area. At higher pressures film quality deteriorates, i.e., hardness, wear resistance, and other useful properties are compromised.

Desirable film properties, such as hardness, scratch resistance and wear resistance, generally require that the film strongly adheres to the substrate. Plasma pretreatment has been reported in the literature as a technique to enhance film adhesion. In particular argon plasma etching has been used for substrate pretreatment before DLC film deposition. D. M. Grant, et. al., "Plasma assisted CVD for biomedical applications," *Diamond and Related Materials*, 1 (1992) 727–730. This pretreatment is limited, however, to pressures of less than 0.1 Torr. Experimental results at higher pressures, e.g., between 0.5 and 7.0 Torr, made in the present studies, demonstrated that argon pretreatment actually reduced film adhesion below that achieved using no argon pretreatment. Similar results were obtained by Bailey et al., U.S. Pat. No. 5,470,661, where they found that the use of helium instead of argon yielded more thermally stable DLC films. We attribute this to better adherence of the helium diluted films over the argon diluted ones.

The quality of DLC coatings can be assessed by measuring the hardness, scratch resistance and wear resistance of the film. It was discovered that these properties correlate with a film's refractive index, which can be obtained using ellipsometry. Low refractive index films, typically with n in the range 1.78 to 1.85 measured with a wavelength of 675 nm, are soft, have low wear resistance and are easily scratched. Higher index films, with n up to 2.45, are hard and wear resistant and are difficult to scratch.

Linear products such as optical fibers, capillary tubing, wires or sheets, present particular coating problems for the present state of the art. Coatings applied at or near atmospheric pressures are relatively soft. To produce DLC coatings with high hardness, low pressure must be used (high vacuum). This is emphasized in Bailey et al., for example, wherein all the improved depositions, even with helium as the diluting gas, were performed at 20 mTorr or 0.020 Torr. The description indicates the processes described in the patent could be up to about 1000 mTorr, i.e. about 1 Torr. These pressures are still low for the kind of throughputs necessary in most commercial applications.

Due to the difficult problem of obtaining relatively high vacuums in an in-line manufacturing system—e.g., when an optical fiber is drawn through a DLC deposition system—linear substrates must be coated at very slow deposition rates. The high vacuum requirement can cause the introduction of flaws, or the further opening of existing microscopic imperfections, on the substrate's surface as the linear product is drawn through a tight-fitting entry gate into the low-pressure deposition areas, or through multiple gates into increasingly lower pressure areas until the deposition area is reached. Thus the prior art even in Bailey et al. are operating at pressures below what would be good for commercial applications, particularly for linear products such as optical fibers.

Another feature common to current prior art is the use of high frequency sources for the rf fields assisting the plasma formation. In Ovshinsky et at, U.S. Pat. No. 4,663,183, the operating radio frequency is typically 13.56 MHz and is recommended as being from above 0.1 MHz, i.e. above 100 kHz. It has been found that frequencies well below the prior art minimum provide particular benefits in conjunction with the higher pressures described below leading to higher deposition rates than expected.

BRIEF SUMMARY OF THE INVENTION

It is an object of the present invention to solve these problems by providing a process wherein hard, wear-resistant diamond-like carbon coatings can be produced at gas pressures above 1 Torr and at deposition rates above 0.4 μm/hr.

It is further an object of the present invention to provide a process wherein hard, wear resistant, DLC coatings can be produced in-line on linear products at elevated gas pressures and elevated rates of deposition.

It is also an aim of the present invention to provide a process wherein a hermetic DLC coating is applied to linear products at elevated gas pressures and elevated rates of deposition.

It is an additional aim of the current invention to provide a process wherein hermetic DLC coatings are applied to individual substrates at pressures elevated above 1 Torr and at deposition rates above 0.4 μm/hr.

Briefly stated, the present invention is a rf plasma aided chemical vapor deposition process, wherein a precursor gas stream having a high helium content produces strong, wear resistant, hermetic, and high refractive index DLC coatings on numerous substrates and at deposition rates of at least 0.4 μm/hr. Interior pressures of 1 to 10 Torr and radio frequencies no higher than 100 kHz are employed. Such methods may be used with both batch and in-line production techniques. With linear products such as optical fibers, capillary tubing, wires, and sheets the methods allow coating in-line while minimizing introduction of external flaws or the exacerbation of existing flaws on the substrate surfaces. Effects of flaws on the product surface can be minimized further by introducing a helium etch of the surface prior to exposure to the DLC coating precursor gas mixture. Thus, strong and hermetic DLC coated products may be produced at commercially attractive deposition rates and without significantly reducing the substrate's initial strengths.

The above, and other objects, features and advantages of the present invention will become apparent from the following description read in conjunction with the accompanying drawings.

DETAILED DESCRIPTION OF THE PREFERRED EMBODIMENTS

Intense plasmas form at high pressures, often raising substrate temperatures beyond the substrate's ability to resist thermal damage. Incorporation of any inert gas, such as argon or helium, into the reactive mixtures causes a cooling effect, moderating the effects of the intense plasma. To improve film growth rates and properties at higher pressures, inert gases were added to reactant hydrocarbon and hydrogen gas mixtures. Experimentally it was determined that when argon was added, it had a deleterious affect on film quality. Refractive indices were low and films were soft. In contrast film growth rates and film quality improved with the addition of helium. It was also experimentally established that useful rf initiated plasmas could be created using frequency ranges between 10 kHz and 100 kHz. Results using He as the inert gas and an rf frequency of 40 kHz are exemplified in Table 1 for deposition of films from methane/hydrogen/helium gas mixtures at a total gas pressure of approximately 1 Torr for each experiment.

TABLE 1

| Exp. No. | Pressure, Torr | $CH_4$, sccm | $H_2$, sccm | He, sccm | Growth μm/hr | R. Index n |
|---|---|---|---|---|---|---|
| 1 | 0.8 | 32 | 60 | None | 0.15 | 2.28 |
| 2 | 0.9 | 32 | 60 | 60 | 0.45 | 2.25 |
| 3 | 0.9 | 13 | 60 | None | 1.65 | 2.09 |
| 4 | 0.9 | 13 | 60 | 60 | 1.08 | 2.23 |

The effect of helium on film growth rates is illustrated by comparing the results of experiments 1 and 2. In both the flow of methane and that of hydrogen were held constant at 32 sccm and at 60 sccm respectively. The total gas pressure was substantially constant at 0.8–0.9 Torr. In experiment 1 without any helium, a film with a refractive index n of 2.28 was produced at a growth rate of 0.15 μm/hour. Addition of helium at a flow rate of 60 sccm yielded a film with an essentially equivalent refractive index of n=2.25, but a three times faster growth rate of 0.45 μm/hour.

The effect of helium on film quality is illustrated by comparing the results of experiments 3 and 4. At a lower flow rate for methane, compared to the previous experiments, a faster growth rate was observed but with a reduction of the refractive index, indicating a coating with a reduced degree of the desired properties of DLC coatings. Here an addition of helium improves the refractive index of the film, while the growth rate is only slightly diminished.

Figure 1:
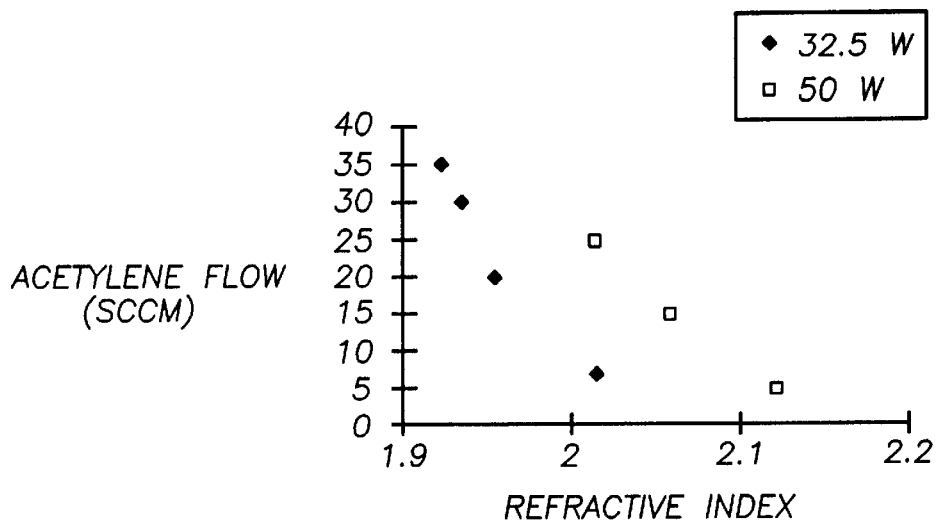
FIG. 1 illustrates how a DLC film's refractive index varies with acetylene concentration at a constant helium flow.

In another series of experiments, acetylene was used as a hydrocarbon precursor gas. Growth rates as fast as 4.5 μm/hour were observed with a total pressures of about 1 Torr and acetylene/helium ratios of approximately 1:4. Films made under these conditions had refractive indices of about 1.84. For a number of varying levels of gas pressure and flow rates, addition of helium produced higher growth rates and films with higher refractive indices than when the helium was excluded. At a constant helium flow of 300 sccm, film refractive index variation with changes in deposition parameters could be measured. For example, the effect of varying acetylene concentration on resultant film refractive index is shown in FIG. 1. As the flow rate of acetylene increases from 7 sccm to 40 sccm, the refractive index of the deposited film decreases from 2.01 to 1.84.

The effects of helium addition is even more dramatic at pressures greater than 1 Torr. Homogeneous DLC films with refractive indices up to 1.99 can be obtained at pressures as high as 5 Torr. At this pressure without helium, only very soft, non homogeneous films are normally deposited. Table 2 presents the deposition conditions and film properties of several films deposited at 5 Torr using the current invention.

TABLE 2

| Exp. No. | $C_2H_2$, sccm | $H_2$, sccm | He, sccm | Power, W | R. Index, n | Growth, μm/hr |
|---|---|---|---|---|---|---|
| 5 | 13 | None | 500 | 25 | 1.90 | 1.7 |
| 6 | 13 | None | 150 | 25 | 1.86 | 3.0 |
| 7 | 13 | 80 | 300 | 32.5 | 1.70 | 2.7 |
| 8* | 32/$CH_4$ | 90 | 297 | 32.5 | 1.99 | 0.2 |

*Experiment 8 used methane as the hydrocarbon source. Total pressure in each experiment was 5 Torr.

While high refractive indices were obtainable with methane as a hydrocarbon source shown in Table 2, growth rates tended to be slow. As a result acetylene is a preferable hydrocarbon source.

FIG. 1 shows the results of two sets of experiments were the flow rate of the carbon-carrying precursor gas, acetylene, was varied while three other variables related to hardness and deposition rates were held constant: pressure in the deposition camber at 0.9 Torr; the helium flow rate at 300 sccm; and, the rf frequency at 40 kHz. The power used by the rf frequency generator was varied, with one set of tests run with 32.5 W and the other set run with 50.0 W as indicated in the figure. This figure shows the desirability of using the higher power if frequency generator setting to gain better DLC (higher n) properties when attempting to maximize acetylene flow rates.

Figure 2:
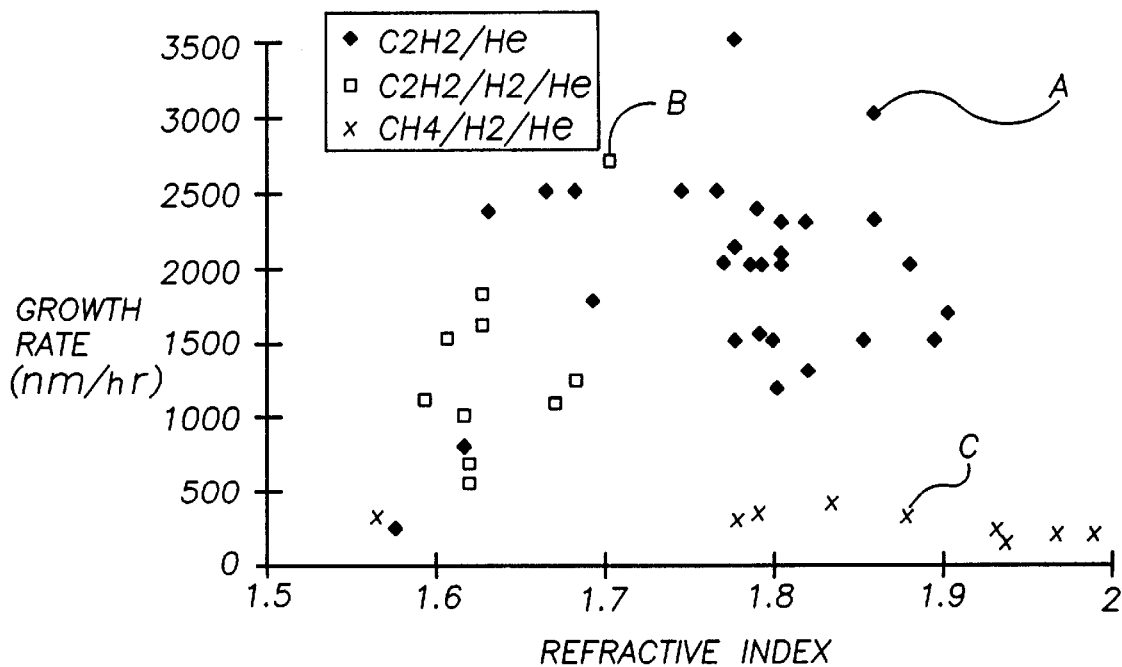
FIG. 2 illustrates how a DLC film's refractive index varies with deposition rates at a constant acetylene partial pressure.

FIG. 2 presents a plot of refractive index versus deposition rate for films using an acetylene-based precursor gas. FIG. 2's data was recorded using the following range of deposition conditions:

Pressure: 5 Torr
rf Power: 17–37 W
$H_2$ Flow Rate: 50–400 sccm
He Flow Rate 75–750 sccm
$C_2H_2$ Flow Rate: 1–20 sccm Graph point A shows a DLC film deposition rate of 3.0 mm/hour where the resultant film has a refractive index, n, of 1.86. Graph points B show generally what happened when hydrogen was used as well as acetylene and helium; the resultant DLC films all had n less than 1.7 indicating a relatively soft coating. Graph point C shows a resultant DLC film having similar n as point A but with a significantly lower deposition rate: 300 nm/hr as compared with point A's 3000 nm/hr. This makes a significant difference in the production of the coated fibers as explained in the next paragraph.

A DLC layer 25 nm deep is needed to achieve a hermetic coating. If the plasma field inside a deposition chamber has a length of 5 meters and the deposition chamber is held at 5 Torr, the total time the fiber should spend in the plasma using the precursor gas indicated by point A is: (hr/3000 nm)(60 min/hr) (25 nm)=0.5 min. That gives a draw speed through the 5 meter plasma field of 10 m/min. Using the precursor gas mixture indicated by point C rather than point A the draw rate would be reduced by an order of magnitude, to 1 m/min. This is a significant commercial difference in manufacturing rates.

Figure 3:
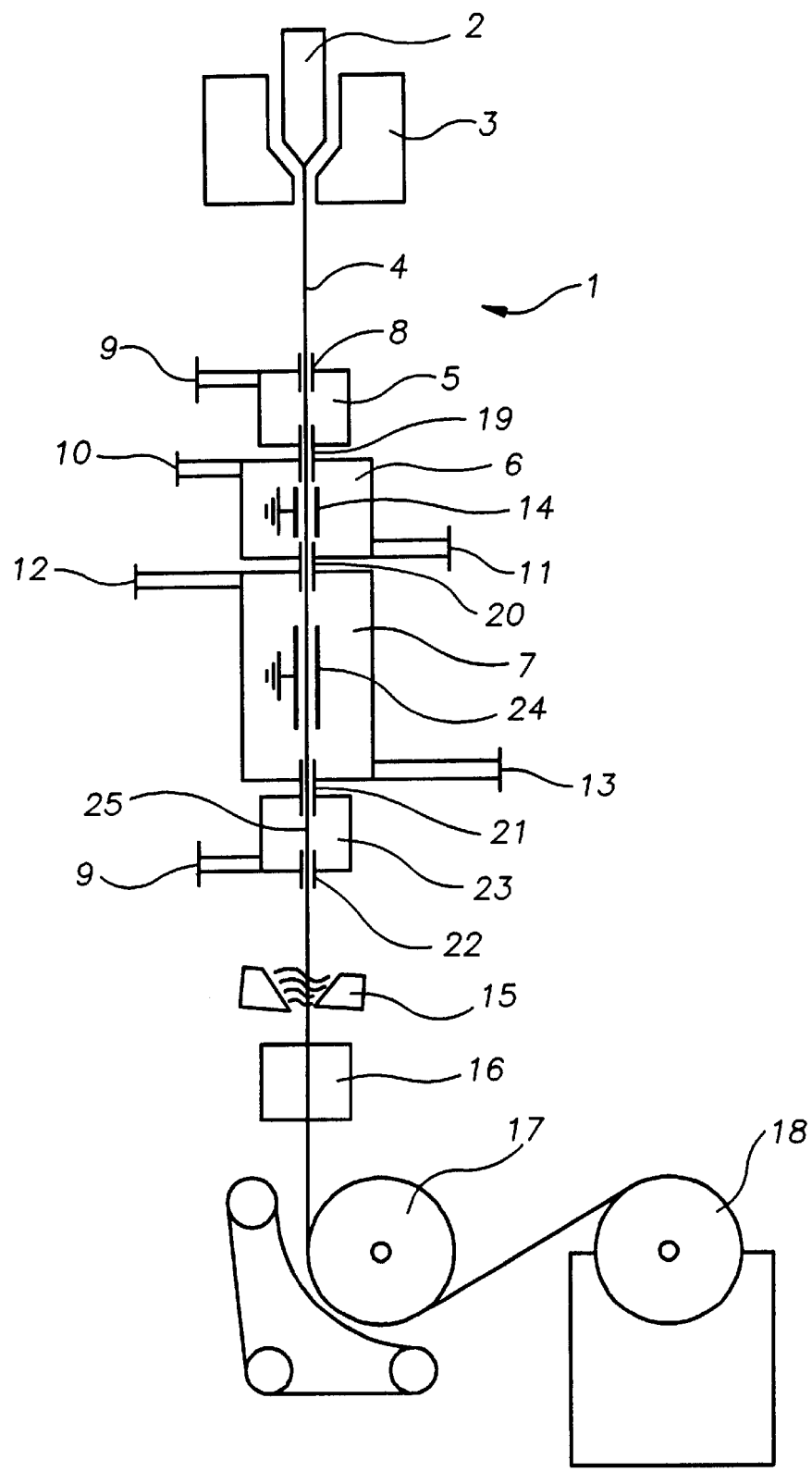
FIG. 3 presents a schematic of a preferred embodiment of the deposition process wherein optical fibers are coated with a DLC coating.

FIG. 3 shows a preferred embodiment of DLC deposition system 1. Fiber preform 2 is pulled through draw oven 3 to form uncoated fiber 4. Portals 8, 19, 20, 21, and 22 are made using scratch-free seals. Uncoated fiber 4 is drawn through portal 8 into evacuation chamber 5 and then through portal 19 into surface preparation chamber 6. A helium mixture with air, similar in proportion to the precursor gas where the deposition gas or gases are replaced with air, is brought into preparation chamber 6 via inlet 9 and is evacuated via outlet 11. While traveling through surface preparation chamber 6, the helium traverses a plasma field which is generated between rf electrodes 14. Uncoated fiber 4, now having a helium surface etch, is drawn through portal 20 into deposition chamber 7. Precursor gas is drawn into deposition chamber 7 via inlet 12, through the plasma field generated by rf electrodes 24, and expelled after reaction via outlet 13. DLC coated fiber 25 is drawn through portal 21 into evacuation chamber 23. DLC coated fiber 25 is then drawn through portal 22 to exit the DLC deposition area. DLC coated fiber 25 may then be optionally drawn through an addition coating or cladding chamber 15, then optionally through a U-V treatment chamber 16, around pinchwheel 17 and is finally wound by take-up spool 18.

From FIG. 3, the relative dimensions shown there, indicate that typically the time in the surface preparation chamber 6 under the He plasma between electrodes 14 is about ⅕ the time spent in the deposition chamber 7. The precursor gas mixture identified by point A is equivalent to a draw speed of 10 m/min, as determined above, and the dwell time within the reactor chamber is 0.5 min. The time within the surface pretreatment plasma would thus be about 0.1 min. Pretreatment of non-linear products with the He surface etch follows the same exposure time proportion as for the linear product.

Figure 4:
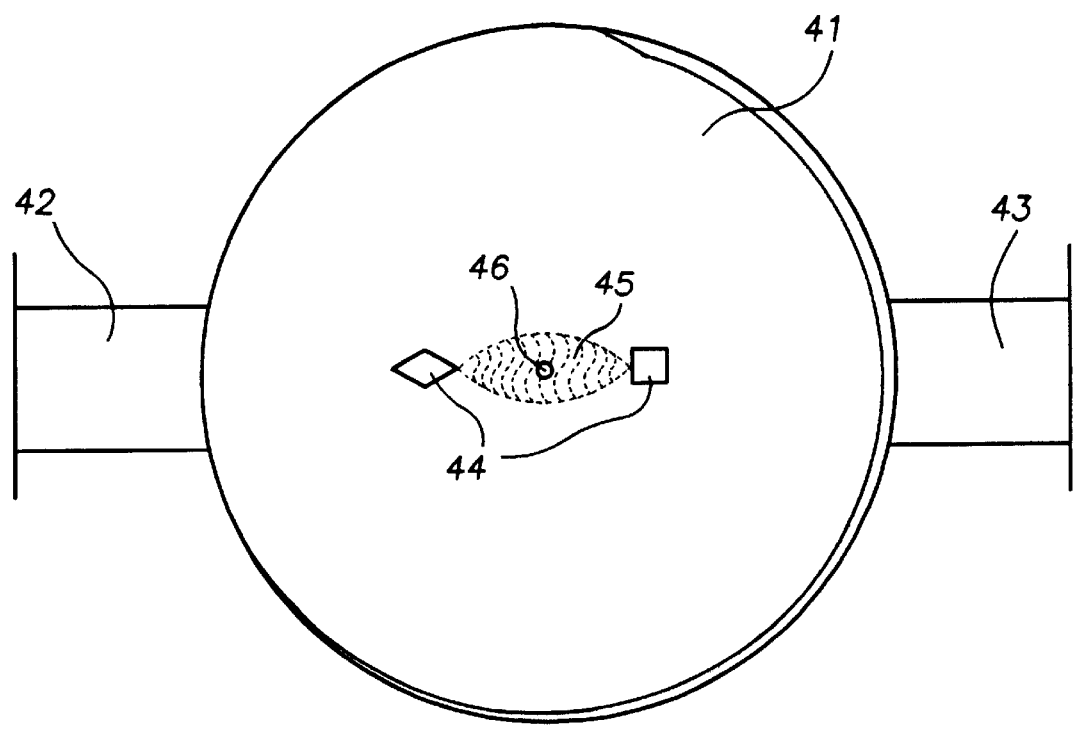
FIG. 4 presents a more detailed cross sectional view of the deposition chamber in FIG. 3.

FIG. 4 is a cross-section of DLC deposition chamber 41. A precursor gas is introduced via gas inlet 42. As the gas passes through DLC deposition chamber 41 to gas outlet 43, it passes between rf electrodes 44 and through plasma field 45 surrounding or close to fiber 46.

Having described preferred embodiments of the invention with reference to accompanying tables, graphs, and drawings, it is to be understood that the invention is not limited to those precise embodiments, and that various changes and modifications may be effected therein by one skilled in the art without departing from the scope or the spirit of the invention as defined in the appended claims.

What is claimed is:

1. A method for depositing protective Diamond-Like-Carbon (DLC) coatings having a refractive index ranging from 1.84 to 2.45 on a substrate at deposition rates above 0.4 $\mu$m/hr and at elevated pressures by plasma enhanced chemical vapor deposition comprising the steps of
    a mixing a hydrocarbon gas and helium to form a precursor gas, wherein said precursor gas comprises at least 40% helium by volume;
    introducing said substrate into a reaction chamber;
    introducing a flow of said precursor gas into said reaction chamber so as to maintain said elevated pressure in said reaction chamber between above 2 Torr and about 10 Torr; and
    inducing a plasma by radio frequency means in said precursor gas in close proximity to said substrate and operating at a frequency of less than 100 kHz.

2. A method according to claim 1, wherein said precursor gas comprises at least 80% He by volume and said elevated pressure of said reaction chamber is between 3 and 7 Torr.

3. A method according to claim 1, wherein said precursor gas is comprised of acetylene and helium and is free of hydrogen.

4. A method according to claim 1, wherein said radio frequency means of inducing said plasma is operated at a frequency between 30–50 kHz.

5. A method according to claim 1, further comprising:
    exposing said substrate, after its introduction into said reaction chamber, to a helium surface etch prior to introduction of said precursor gas, wherein said helium surface etch is effected by exposure to a mixture of helium and air, in proportions equivalent to that of said precursor gas, wherein said air is substituted for said hydrocarbon gas component in said precursor gas, while a plasma is induced by radio frequency means.

6. A method for depositing protective Diamond-Like-Carbon (DLC) coatings having a refractive index ranging from 1.84 to 2.45 on a linear substrate at deposition rates above 0.4 $\mu$m/hr and at elevated pressures by plasma enhanced chemical vapor deposition comprising the steps of:
    a mixing a hydrocarbon gas and helium to form a precursor gas, wherein said precursor gas comprises at least 40% helium by volume;
    drawing said linear substrate into a reaction chamber in a continuous stream through vacuum-containing gates;
    introducing a flow of said precursor gas into said reaction chamber so as to maintain said elevated pressure in said reaction chamber between above 2 Torr and about 10 Torr; and
    inducing a plasma by radio frequency means in said precursor gas in close proximity to said substrate and operating at a frequency of less than 100 kHz.

7. A method according to claim 6, wherein said precursor gas comprises at least 80% He by volume and said elevated pressure of said reaction chamber is between 3 and 7 Torr.

8. A method according to claim 6, wherein said precursor gas is comprised of acetylene and helium and is free of hydrogen.

9. A method according to claim 6, wherein said radio frequency means of inducing said plasma is operated at a frequency between 30–50 kHz.

10. A method according to claim 6, further comprising:

exposing said linear substrate a surface preparation chamber to a helium surface etch, prior to entry into said reaction chamber and exposure to said precursor gas, wherein said helium surface etch is effected by exposure to a mixture of helium and air, in proportions equivalent to that of said precursor gas, wherein said air is substituted for said hydrogen gas component in said precursor gas, while a plasma is induced within said surface preparation chamber by radio frequency means.

* * * * *